United States Patent [19]

Nagel et al.

[11] Patent Number: 5,757,712
[45] Date of Patent: May 26, 1998

[54] MEMORY MODULES WITH VOLTAGE REGULATION AND LEVEL TRANSLATION

[75] Inventors: Johann W. Nagel, Underhill; Mark W. Kellogg; Bruce G. Hazelzet, both of Essex Junction, all of Vt.

[73] Assignee: International Business Machines Corporation, Armonk, N.Y.

[21] Appl. No.: 678,867

[22] Filed: Jul. 12, 1996

[51] Int. Cl.[6] ............................................. G11C 5/14
[52] U.S. Cl. ............................... 365/226; 365/189.11
[58] Field of Search .............................. 365/226, 227, 365/228, 189.11

[56] References Cited

U.S. PATENT DOCUMENTS

| | | | |
|---|---|---|---|
| 5,058,063 | 10/1991 | Wada et al. | 365/189.11 |
| 5,222,044 | 6/1993 | Tsujimoto | 365/226 |
| 5,285,412 | 2/1994 | Sugibayashi | 365/226 |
| 5,309,399 | 5/1994 | Murotani | 365/226 |
| 5,327,388 | 7/1994 | Kobayashi | 365/226 |
| 5,339,269 | 8/1994 | Takagi | 365/226 |
| 5,373,477 | 12/1994 | Sugibayashi | 365/226 |
| 5,398,207 | 3/1995 | Tsuchida et al. | 365/226 |
| 5,440,519 | 8/1995 | Mart et al. | 365/226 |
| 5,450,365 | 9/1995 | Adachi | 365/226 |
| 5,490,117 | 2/1996 | Oda et al. | 365/226 |
| 5,493,234 | 2/1996 | Oh | 365/226 |
| 5,563,838 | 10/1996 | Mart et al. | 365/226 |

*Primary Examiner*—David C. Nelms
*Assistant Examiner*—Vu A. Le
*Attorney, Agent, or Firm*—Whitham, Curtis, Whitham & McGinn; Robert A. Walsh

[57] ABSTRACT

Low voltage DRAMs are used on higher voltage memory modules in a way that requires no modification of the DRAMs. "Bus switch" technology and compact low voltage regulators are used at the module level. The low voltage regulator provides a lowered, regulated voltage to DRAMs. The bus switches are used at the inputs and outputs of the DRAMs and effectively protect the DRAM circuitry from voltage swings that could otherwise be damaging.

6 Claims, 3 Drawing Sheets

MEMORY MODULES WITH VOLTAGE REGULATION AND LEVEL TRANSLATION

BACKGROUND OF THE INVENTION

1. Field of the Invention

The present invention generally relates to the matching of circuits using different technologies and therefore different power supply voltages and, more particularly, to matching emerging low voltage semiconductor memory devices with existing higher voltage applications.

2. Background Description

Semiconductor technology improvements have necessitated a reduction in power supply voltages, with a corresponding reduction in input/output voltage swings. Unfortunately, many applications have been slow to embrace these new operating conditions. As a result, many current and emerging dynamic random access memory (DRAM) products now have 3.3 volt (V) power supplies and low voltage transistor-transistor logic (LVTTL) interface levels which can be damaged if either a 5V power supply or inputs in excess of 4.1V are applied.

In the past, voltage regulators have been incorporated in integrated circuit (IC) devices which receive the higher voltage power supplied off-chip and reduce and regulate the voltage to a level required for the circuitry on the chip. This approach uses up valuable silicon real estate and does not protect the inputs and outputs of the circuits from voltage swings which are potentially damaging to the circuit. Diode clamps have been used in order to protect inputs and outputs of circuits. However, this solution has proven ineffective in many applications.

A solution is therefore needed to allow these emerging 3.3V DRAMs to operate in 5V applications until systems no longer require this condition. The solution should also apply to the shift from 3.3V to 2.5V power supplies expected in the next few years. Further, the solution should be at the module level, requiring no change in the DRAM. Conventional memory modules are single in-line memory modules (SIMMs) and dual in-line memory modules (DIMMs). Such modules typically represent greater than 65% of DRAM usage. Additional circuitry at the SIMM/DIMM level does not affect application usage.

SUMMARY OF THE INVENTION

It is therefore an object of the present invention to provide a way to use low voltage DRAMs on higher voltage memory modules in a way that requires no modification of the DRAMs.

According to the invention, "bus switch" technology in addition to compact low voltage regulators are used to allow the use of low voltage DRAMs in high voltage applications. The low voltage regulator is incorporated at the module level and provides a lowered, regulated voltage to DRAMs. The bus switches are used at the inputs and outputs of the DRAMs and effectively protect the DRAM circuitry from voltage swings that could otherwise be damaging.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
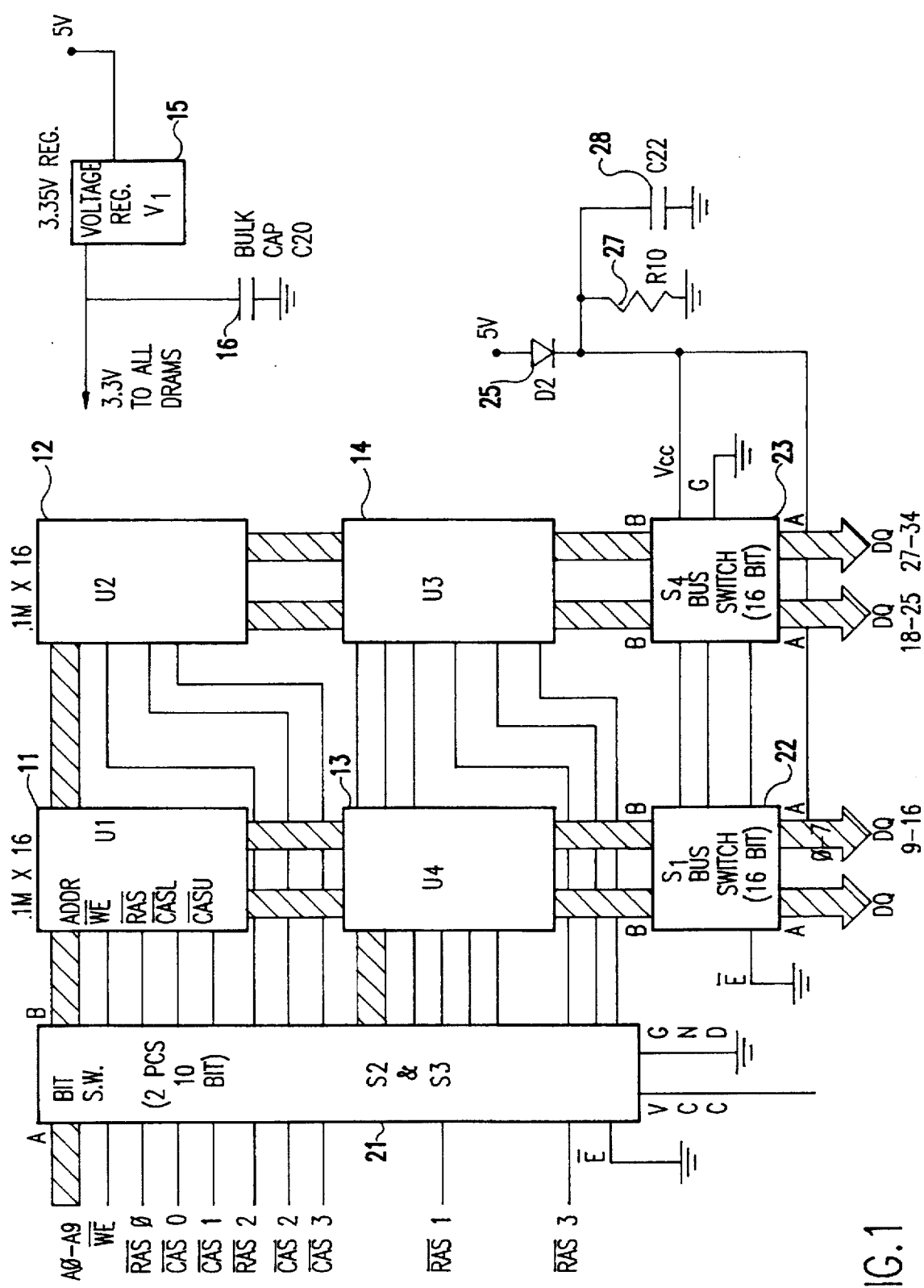
FIG. 1 is a block diagram showing an implementation of a preferred embodiment of the present invention.

Referring now to the drawings, and more particularly to FIG. 1, there is shown a block diagram a specific implementation of the invention. In this implementation, an 8 megabyte (Mb) (2M×32) SIMM is designed using four 3.3 V 1M×16 DRAMs 11, 12, 13, and 14. These are mounted on a 72 pin SIMM shown in FIGS. 2A and 2B, in which like reference numerals designate the same components as in FIG. 1. The 72 pin SIMM is currently a 5V-only standard and continues to be the most widely used memory form-factor in personal computer (PC) applications.

Returning to FIG. 1, the power supply is a 5V to 3.3V regulator 15 used in combination with a bulk capacitor 16 and high frequency decoupling capacitors (not shown in FIG. 1). A specific example of the regulator 15 which may be used in the practice of the invention is manufactured by Linear Technologies as model LT 1117-3.3 5V-3.3V regulator. An off-chip 5V source is connected to the regulator 15, and the regulated 3.3V output of the regulator 15 is supplied directly to the DRAMs 11, 12, 13, and 14.

Level translation is completed through the use of bus switches, here used as bit switches. Bus switch 21 receives as inputs addresses A0 to A9, write enable $\overline{WE}$, row address strobes $\overline{RAS}$, and column address strobes $\overline{CAS}$. A pair of bus switches 22 and 23 receive the data outputs D0 to D16 and D18 to D34 from the DRAMs 11, 13 and 12, 14, respectively. Padding capacitors (not shown) may be added to several SIMM inputs to increase the input loading to better match this implementation to applications designed to use 4Mb-based assemblies. Many applications will design to heavy loading and exhibit significant signal quality degradation if lightly loaded assemblies are installed.

Figure 2A:
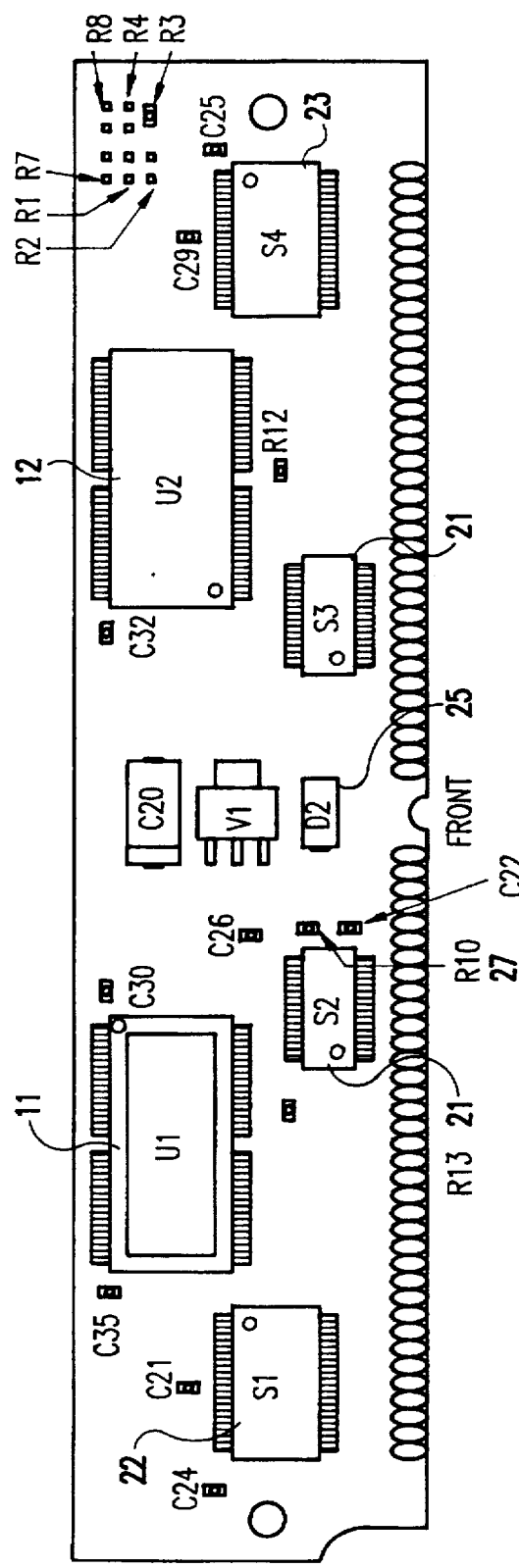
FIGS. 2A and 2B are plan views showing an example of a SIMM on which the implementation of FIG. 1 is fabricated.
Figure 2B:
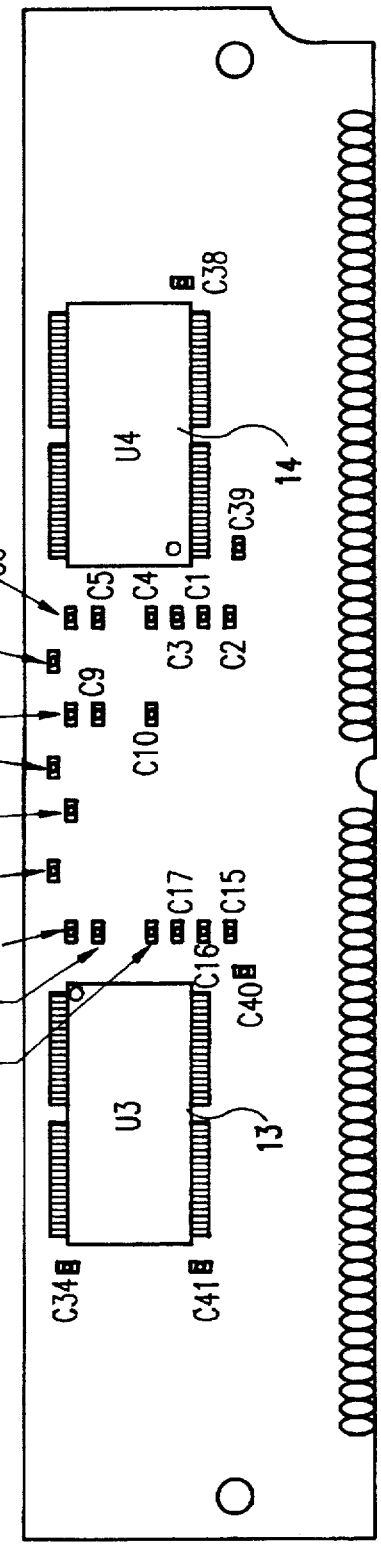

The bus switches are placed horizontally on the SIMM, as shown in FIG. 2A, to provide redrive with minimal delay. As shown in FIG. 2A, the bus switch 21 is implemented as two 10-bit switches, and each of the bus switches 22 and 23 are implemented as 16-bit bus switches. The 10-bit bus switches may be implemented using Pericom PI5C3861 bus switches, and the 16-bit bus switches may be implemented using Pericom PI5C162245 bus switches.

Referring again to FIG. 1, the power supply for the bus switches 21, 22 and 23 is connected to 5V via diode 25, which reduces the bus switch voltage by one diode drop. The bus switches 21, 22 and 23 then set the maximum signal amplitude on the 3.3V side to approximately 3.2V, well within the DRAM specified limits. The diode 25 is maintained in a forward bias condition via series resistor 27 and bypass capacitor 28.

Figure 3:
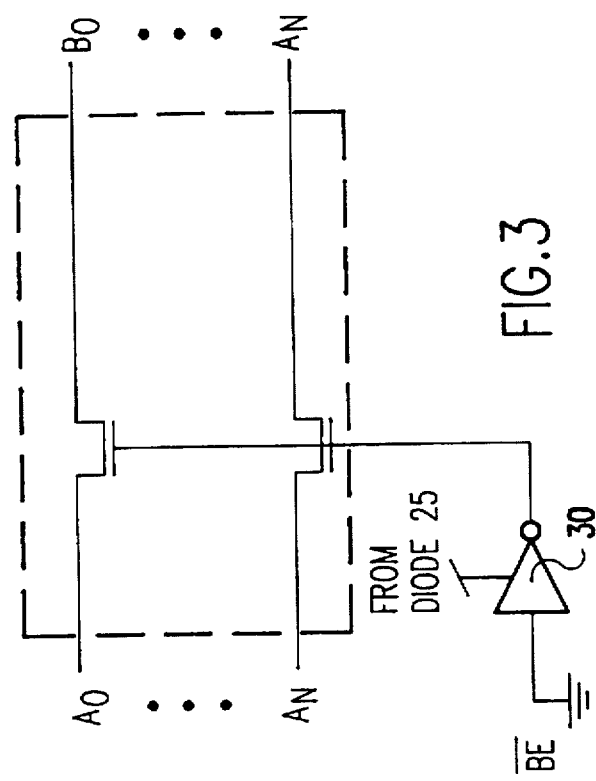
FIG. 3 is a logic block diagram of a bus switch used in the implementation of FIG. 1.

The generalized logic diagram for the bus switches 21, 22 and 23 is shown in FIG. 3. The bus switches comprise a plurality of FETs, one for each line. In the case of the 10-bit bus switch, there would be ten FETs, and in the case of the 16-bit bus switch, there would be sixteen FETs. One or more inverters 30 are used to bias the FETs on. In the practice of the invention, the input to the inverter is grounded so that a positive bias is applied to the gates of the FETs. The source voltage for the inverter 30 is supplied from the anode of diode 25; that is, the source voltage is one diode drop from 5V. In this way, the maximum signal amplitude on the 3.3v side of the DRAMs is maintained at 3.2v.

The delay through this bus switches is less than one nano second (1ns), which ensures proper memory operation. Memory margins are further improved by the reduction in power supply variation that results from the on-board regulator 15.

Figure 4:
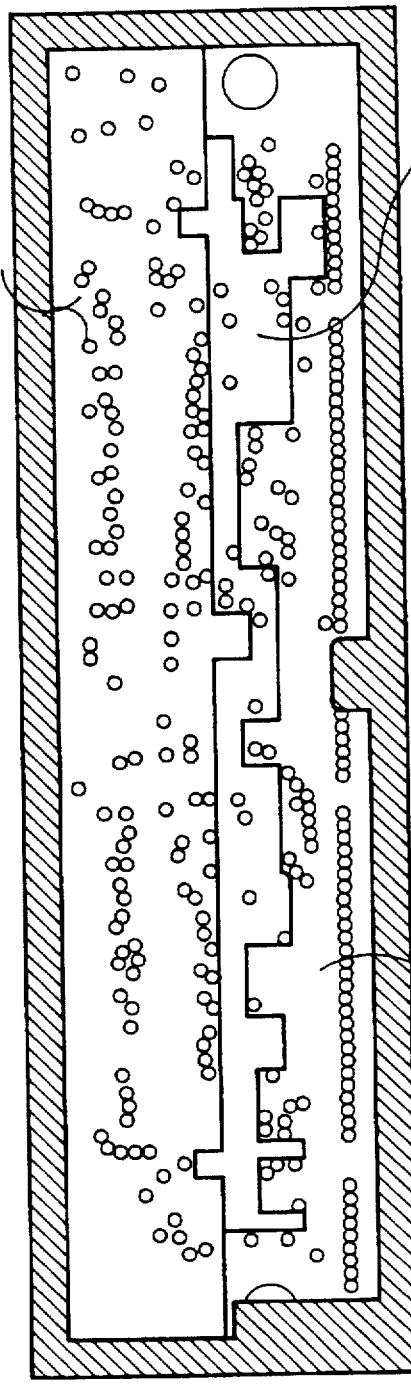
FIG. 4 is a plan view showing the split voltage plane of the SIMM according to a preferred embodiment of the invention.

According to a preferred embodiment of the invention, the construction of the SIMM is a multi-layer printed circuit card including a solid ground plane layer and a second power or voltage plane layer. The voltage plane is split into two portions (5V and 3.3V) to ensure a low impedance path for each. The split voltage plane is shown in FIG. 4 where the 5V portion of the plane is denoted by reference numeral 41, and the 3.3V portion of the plane is denoted by reference numeral 42. It will be observed that between these two planes is a third plane, denoted by reference numeral 43. This plane is connected to the anode of diode 25 and is thus at a voltage one diode drop less than voltage plane 41. The regulator 15 is tied to the 3.3V and 5V planes 42 and 41 by several vias, to further reduce impedance. Both the 5V and 3.3V power planes are decoupled, with bulk capacitors (not shown) also included in the 3.3V plane. Additional capacitor positions are included between the 5V and 3.3V planes as needed. The 3.3V DRAMs 11, 12, 13, and 14 are connected to the 3.3V regulated supply via the 3.3V power plane 42.

A multi-layer printed circuit card with a split voltage plane as shown in FIG. 4 is the preferred construction. It is also possible to construct the printed circuit card with multiple voltage planes in separate layers, although this would be a more expensive construction. Alternatively, the voltages may be routed by surface wiring on the printed circuit card. Such construction would be the least expensive and but would be noisey and therefore not the preferred construction.

The specific implementation shown is by way of example only. Those skilled in the art will recognize that the invention has general application to memory devices of several different types. For example, synchronous DRAMs (SDRAMs) and static random access memories (SRAMs) can be used to the same advantage. Moreover, while the invention has been described for the 5V/3.3V application, those skilled in the art will recognize that the invention can be practiced with modification within the spirit and scope of the appended claims and, in particular, for other voltage combinations such as 3.3V/2.5V applications.

Having thus described our invention, what we claim as new and desire to secure by letters patent is as follows:

1. A memory module comprising:

a printed circuit card including at least a first, higher voltage portion and a second, lower voltage portion;

a plurality of random access memories mounted on the printed circuit card and connected to the second, lower voltage portion;

a voltage regulator mounted on the printed circuit card and having an input connected to the first, higher voltage portion and an output connected to the second, lower voltage portion, the voltage regulator providing a regulated lower voltage to the random access memories; and a plurality of bus switches mounted on the printed circuit card and connected between module pad pins and the inputs and outputs of the random access memories to provide level translation between higher voltage applications and the random access memories, said bus switches limiting voltage swings to the random access memories to a predetermined level.

2. The memory module recited in claim 1 wherein said printed circuit card is a multi-layer printed circuit card including a voltage plane split into at least a first, higher voltage portion and a second, lower voltage portion.

3. The memory module recited in claim 2 wherein said bus switches comprise:

a plurality of field effect transistors (FETs), one for each module pad pin and a corresponding input and output line of the random access memories; and means for biasing said FETs on at a level that limits said voltage swings to said predetermined level.

4. The memory module recited in claim 3 wherein said voltage plane includes a third voltage portion, said bus switches being connected to said third voltage portion, further comprising a forward biased diode connected between said first, higher voltage portion and said third portion of the voltage plane so that the third portion is at a voltage one diode drop from the first, higher voltage portion of the voltage plane.

5. The memory module recited in claim 4 wherein the first, higher voltage portion of the voltage plane is at 5V and the second, lower voltage portion of the voltage plane is at 3.3V.

6. The memory module recited in claim 4 wherein the first, higher voltage portion of the voltage plane is at 3.3V and the second, lower voltage portion of the voltage plane is at 2.5V.

* * * * *